DIGITAL PHASE CONTROL CIRCUIT FOR SYNCHRONIZING AN OSCILLATOR TO A HARMONIC OF A REFERENCE FREQUENCY

Filed June 19, 1968

INVENTORS
PATRICK J. KOBOLD
ROBERT M. THOMAS
JACK W. SCHUCK
BY Charles J. Ungemach
ATTORNEY United States Patent Office 3,534,285
Patented Oct. 13, 1970

3,534,285

DIGITAL PHASE CONTROL CIRCUIT FOR SYNCHRONIZING AN OSCILLATOR TO A HARMONIC OF A REFERENCE FREQUENCY

Patrick John Kobold and Robert M. Thomas, St. Paul, and Jack W. Schuck, Minnetonka, Minn., assignors to Honeywell Inc., Minneapolis, Minn., a corporation of Delaware Filed June 19, 1968, Ser. No. 738,141
Int. Cl. H03b 3/04; H03d 3/20
U.S. Cl. 331—10 5 Claims

ABSTRACT OF THE DISCLOSURE

A system for synchronizing the frequency of an oscillator at a harmonic of a reference frequency signal. The frequency of the oscillator is maintained at the proper harmonic by a system including a digital counter. The oscillator cycles are counted by the digital counter during a cycle of the reference signal. The reference signal and a signal developed at the output of the most significant stage of the counter are compared in a phase detector which generates an error signal if the signals compared are of a different frequency or are out of phase. The error signal is used to change the frequency of the oscillator until the error signal is nulled or minimized.

BACKGROUND OF THE INVENTION

The invention is in the general field of oscillators. Specifically, the invention includes an oscillator operating at a frequency which corresponds to a predetermined multiple or harmonic of a reference frequency. For example, if the reference frequency is one cycle per second, the oscillator may be maintained at 8 cycles per second, the 8th multiple. Maintaining the frequency of the oscillator at the proper multiple can be a problem. For example, if the frequency of the oscillator is properly 8 cycles per second and it is operating at the eighth multiple of the reference frequency it may also be possible for it to operate at sixteen cycles per second, the sixteenth multiple. Obviously, this is undesirable and the present invention solves the problem. The frequency of the oscillator is maintained at the proper multiple of and at a constant phase with the reference frequency.

SUMMARY

The invention is a frequency synchronizer which may be used for timing a multiplexer, multiplying a frequency, or dividing the period of a reference signal into any number of equal time periods. The synchronizer may, for example, be used as a computer clock, as a multiplexer for multiplexing several independent inputs into a computer addressed system, as a time delay device in a time delay network, or as a phase splitting network in a computer clock.

The basic elements of the synchronizer are a voltage controlled oscillator (VCO) and a binary counter. The output of the VCO advances the counter which develops a signal that is compared with the reference frequency signal. As a result of the comparison an error signal is developed which is used to control the VCO, forcing it to match in harmonic frequency and in phase the reference frequency. The reference frequency signal also resets the counter. The output of the VCO advances the counter from its "empty" to its "full" state, but will not advance it beyond the "full" state, that is, return it to the "empty" state. The counter is returned to its "empty" state only when it is reset by the reference frequency signal. The counter is reset when the reset signal is received regardless of its current state. When the system is synchronized, that is, when the VCO is oscillating at the proper multiple of the reference frequency, the output of the last or most significant stage of the counter is in synchronism with the reference frequency signal. The output of the last stage of the counter is in phase with and has a frequency equal to that of the reference frequency signal and it is symmetrical. The output of the last stage is symmetrical in that both states of the last stage occur for equal periods of time during a complete cycle of the stage. The zero crossing point of the reference frequency signal is compared with the point at which the state of the last stage of the counter changes. If these points do not coincide in time an error signal is developed which is used to change the frequency of the VCO, causing the output signal of the last stage of the counter to change until the error signal is nulled and the system is again synchronized.

An important feature of the invention is insuring that the counter counts groups of pulses in the proper multiple. For example, if the VCO is supposed to operate at 8 c.p.s., the eighth multiple, then the counter should count pulses in groups of 8 and not in groups of 16, 24, 32, etc.

DESCRIPTION OF THE PREFFERED EMBODIMENT

Figure 1:
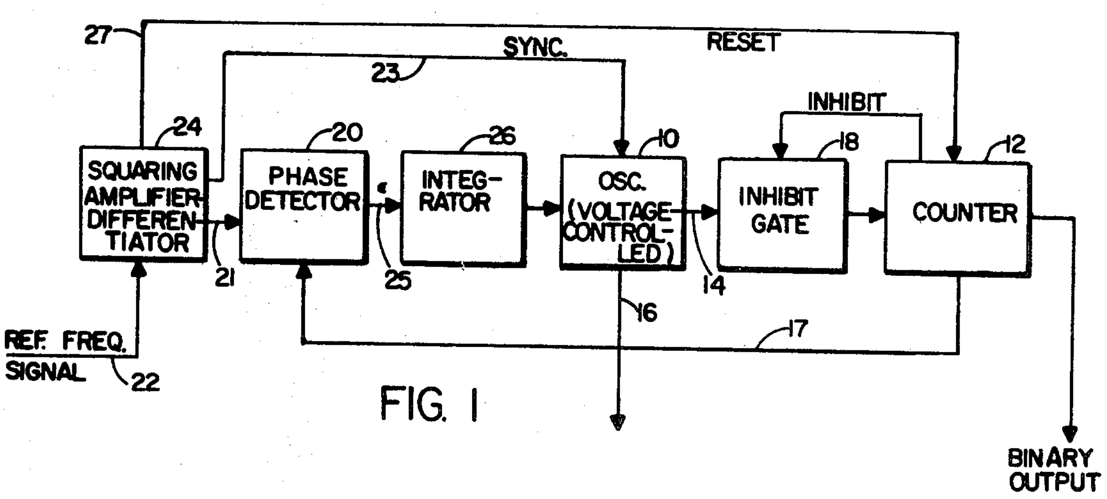
FIG. 1 is a simplified block diagram of the frequency synchronizer.

The basic elements of the frequency synchronizer shown in FIG. 1 are a voltage controlled oscillator 10 and a binary counter 12. Oscillator 10 provides two output signals. One signal is developed on an output line 14 and the other signal is developed on an output line 16. The signal developed on line 16 is sinusoidal whereas the signal developed on line 14 is a series of pulses. Both signals are at the same frequency and in phase. If counter 12 is not "full" the pulses on line 14 pass through a gate 18 and advance counter 12. If counter 12 is "full" gate 18 is inhibited and pulses can no longer pass through it.

One of the complementary outputs of the last stage of counter 12, present on an output line 17, is fed to a phase detector 20 where it is compared with a reference frequency signal. The other output signal of the last stage of counter 12, present on a line 61, is also fed to phase detector 20 where it is compared with the reference frequency signals. The output signals on lines 17, 61 are complementary, i.e., they are 180° out of phase. The reference frequency signal is generated by a source (not shown). This signal is fed, by a line 22, to a squaring amplifier-differentiator circuit 24 included in the source. Circuit 24 shapes the reference frequency signal and it is applied to detector 20 on an output line 21. Detector 20 develops an error signal, designated $\epsilon$, on its output line 25 if the frequency or phase of the last stage of counter 12 does not correspond to the frequency and phase of the reference frequency signal. The error signal is processed in an amplifier-integrator circuit 26 and then applied to oscillator 10 to control its frequency. The frequency of oscillator 10 is controlled such that the error signal at the output of amplifier-integrator circuit 26 tends to be nulled or minimized. When the error signal is nulled the system is balanced and the frequency of oscillator 10 is synchronized with the reference frequency signal.

Circuit 24 also provides a signal on an output line 23 which is applied to oscillator 10 and a signal on an output line 27 which is applied to counter 12. The signal applied to oscillator 10 aids in synchronizing it and the signal applied to counter 12 is used to reset it. Counter 12 is reset whenever it receives a reset signal regardless of its current state.

Figure 2:
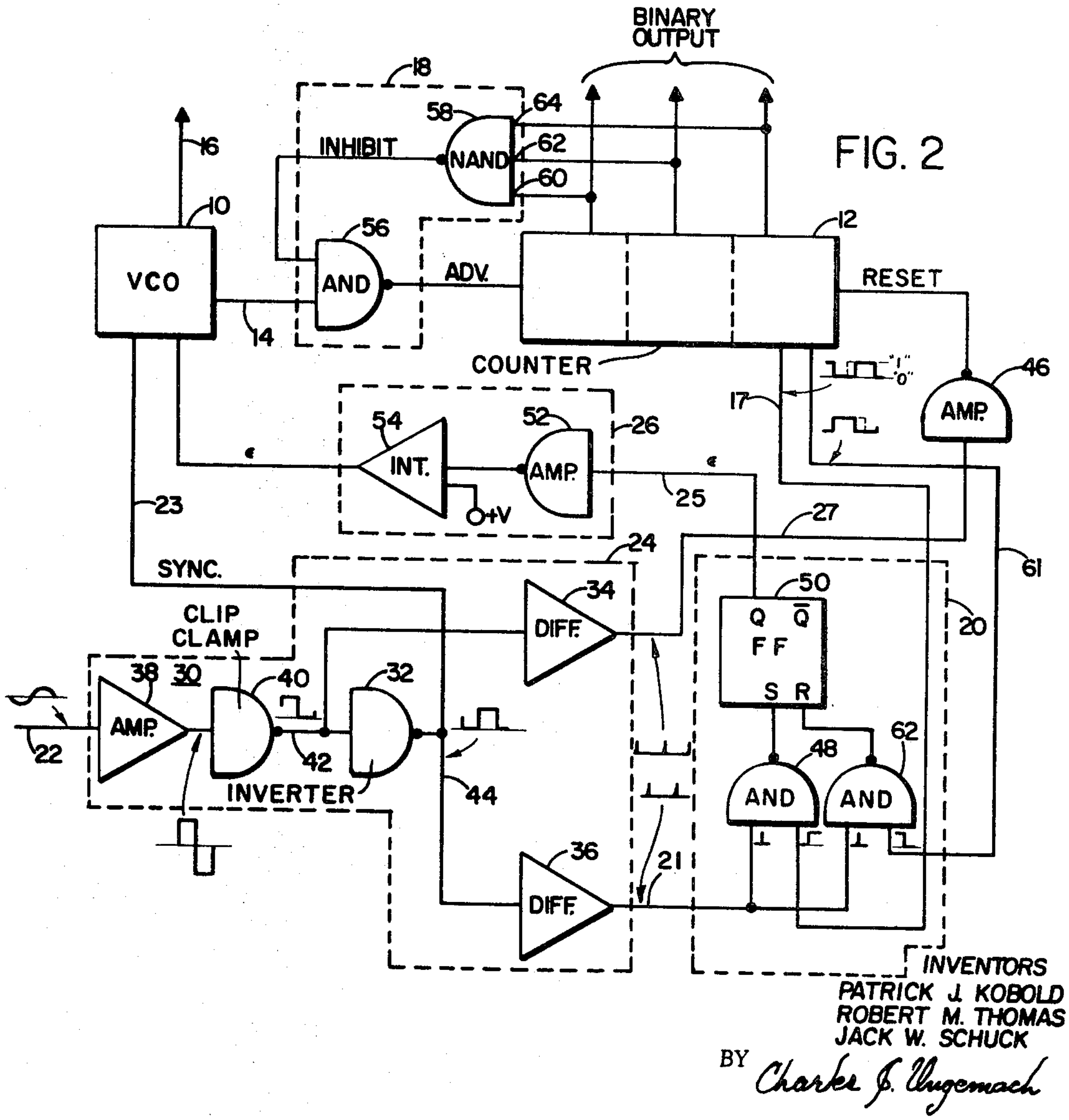
FIG. 2 is a detailed block diagram of the frequency synchronizer system.

In FIG. 2 the reference frequency signal on line 22 is applied to a saturation amplifier 30 in shaping circuit 24. Saturation amplifier 30 amplifies and clips the reference frequency signal. Circuit 24 also includes an inverter 32 and differentiators 34 and 36. Saturation amplifier 30 includes an amplifier 38 and a standard logic gate 40. The combination of amplifier 38 and gate 40 forms a saturation amplifier which functions as a squaring circuit. Gate 40 clips the output signal of amplifier 38 and clamps it at the logic levels selected for use in the system. For example, if positive logic is selected for the system the logic levels may be +5 volts corresponding to a logical 1 ("1") and 0 volts corresponding to a logical 0 ("0"). The output of amplifier 38 does not swing between these levels and gate 40 operates upon the signal so that it does swing between +5 and 0 volts. A standard logic gate is very easily adapted to provide this function, e.g., by using an "or" gate with only a single input being used. The output of saturation amplifier 30, on a line 42, has been inverted in the shaping process and inverter 32 is necessary to reinvert it. A standard logic gate is used as inverter 32. Here the standard logic gate may be a "nor" gate wherein only a single input is energized. Re-inversion is necessary because only positive signals can be handled by the logic selected for the system. However, the particular logic selected is a matter of choice.

The output of the saturation amplifier, on line 42, is applied to differentiator 34, and the output of inverter 32, on a line 44, is applied to differentiator 36. The outputs of differentiators 34 and 36 are positive signals (spikes) spaced 180° apart in phase. The output of differentiator 34, on line 27, is applied to a standard logic gate 46. Gate 46 may be an "or" gate which functions as an amplifier, increasing the signal on line 27 to a level that is sufficient to reset counter 12 (i.e., reestablishing logic levels). The output of inverter 32 is also applied to oscillator 10, by line 23, and aids in synchronizing it.

The output signal of differentiator 36 present on a line 21, a first output signal derived from the most significant stage of counter 12, present on line 17, and a second output signal derived from the most significant stage of counter 12 (the complement of the first output signal), present on line 61, are fed to "and" gates 48 and 62, the outputs of which activate the S and R inputs respectively of a flip-flop 50. The signal on line 21 is fed to one input of each of the "and" gates 48 and 62. The signal on line 17 is fed to the other input of "and" gate 48 and the signal on line 61 is fed to the other input of "and" gate 62. "And" gates 48, 62, and flip-flop 50 make up detector 20. The output of differentiator 36 is effectively compared with the switching point of the most significant stage of counter 12 in "and" gates 48 and 62 and flip-flop 50 is activated accordingly. Flip-flop 50 is driven to its appropriate state whenever differentiator 36 provides a trigger pulse. If the two complementary square-wave signals representing the state of the most significant stage of counter 12 are symmetrical, "and" gate 48 is provided with an enabled signal on line 17 at the same time it receives a pulse (trigger) on line 21. If the enable and trigger signals are received at the same time, the enable signal is ineffective and the trigger signal does not pass through "and" gate 48, leaving the state of flip-flop 50 unchanged. Conversely, if the enable signal is removed from "and" gate 62 simultaneously with the application of a trigger pulse, the trigger pulse does not pass through "and" gate 62. This is the case when the output of the most significant stage of counter 12 is symmetrical. Neither "and" gate 48 nor "and" gate 62 is passing the trigger pulses which are present on line 21. Assume now that the frequency of oscillator 10 increases or decreases.

If the frequency increases the last stage of counter 12 assumes a "1" state sooner. Referring to the waveform associated with line 17 this means that the positive-going leading edge of the "1" part of the waveform will occur sooner enabling "and" gate 48 so that a trigger pulse is applied to the set (S) input of flip-flop 50 causing it to change its state which changes the polarity of the input to integrator 54. The output level of integrator 54 changes in the proper direction to decrease the frequency of oscillator 10.

If the frequency of oscillator 10 decreases the trailing-edge of the "1" portion of the waveform associated with line 61 occurs later, enabling "and" gate 62 so a trigger pulse from line 21 passes through it and changes the state of flip-flop 50. This causes the polarity of the input to integrator 54 to change, the output of integrator 54 then changing so as to increase the frequency of oscillator 10. Actually the system corrects in one direction for a while and then in the second direction for a while, continuously swinging about an optimum operating point.

The output of flip-flop 50 is fed to the amplifier-integrator circuit 26 which is made up of an amplifier 52 and an integrator 54. The level of the output signal of flip-flop 50 is increased by amplifier 52 such that the average level of the signal at the output of amplifier 52 is +V volts when the overall system is nulled or balanced. Amplifier 52 also acts as a buffer. The signal at the output of amplifier 52 is applied to one input of integrator 54. A reference signal of +V volts is applied to another input of integrator 54. Integrator 54 functions to compare the amplified output of flip-flop 50 with the reference signal +V volts. When the system is balanced the output of integrator 54 swings slightly about some null voltage level. The output signal of integrator 54 is applied to voltage controlled oscillator 10 and controls its frequency.

Oscillator 10 generates a sinusoidal output signal on line 16 and a square-wave signal on line 14. Line 14 is connected to one input terminal of a gate 56, which is included in inhibit gate 18. "Nand" gate 58 is also included. The output of gate 58 is connected to the other input terminal of an "and" gate 56. Gate 58 has three input terminals 60, 62, and 64, connected to the first, second, and third stages, respectively, of counter 12. Counter 12, of course may have more or less than three stages, each one connected to an "nand" gate such as gate 58. A three stage counter is selected merely as an example. The number of stages depends upon the relationship between the frequency reference signal and the oscillator frequency. For example if the frequency reference signal is 1 cycle per second and the VCO frequency is 8 cycles per second, an 8-state counter is required, e.g., a three stage binary counter as shown in FIG. 2. If instead the oscillator frequency is 16 c.p.s. a 16-state, e.g., a 4 stage binary counter would be required. Other kinds of counters can be used.

Pulses from oscillator 10, on line 14, pass through "and" gate 56 and advance counter 12 until it is filled. At this time "nand" gate 58 develops an output signal which inhibits "and" gate 56, preventing oscillator pulses from passing through. Counter 12 can be advanced again only after being reset. Reset pulses are present on line 27.

It is to be understood that this arrangement is illustrative of the application of the principles of the invention. Other arrangements may be devised by those skilled in the art without departing from the spirit and scope of the invention.

What is claimed is:

1. A frequency synchronizer, comprising:

a controllable oscillator having a control input means and an output means, designed to operate at a predetermined frequency;

a counter having a predetermined number of stages, reset means, and advance means;

a signal source, including shaping means, having a reference frequency which is a predetermined subharmonic of the oscillator frequency, and providing a sync signal to the oscillator and a reset signal to the counter;

gating means connected between the output means of the oscillator and the advance means of the counter, the gating means being responsive to the state of the counter and inhibited whenever the counter reaches a predetermined state;

a detecting means connected to the signal source and the most significant stage of the counter, generating an error signal when the most significant stage is not in phase with the signal source; and, means for integrating the error signal and applying it to the control input means of the oscillator, causing the oscillator frequency to vary until the error signal is minimized.

2. The apparatus of claim 1 wherein the counter has $n$ binary stages, $n$ selected such that $2^n$ is equal to the ratio of the oscillator and reference frequencies.

3. The apparatus of claim 1 wherein the shaping means included in the signal source squares the reference signal and includes means for amplifying and clipping the reference signal.

4. The apparatus of claim 1 wherein the gating means includes a "nand" gate, each stage of the counter connected to an input means of the "nand" gate, an "and" gate having first and second input means, the first input means connected to an output means of the "nand" gate, and the second input means connected to the output means of the oscillator, an output means of the "and" gate connected to the advance means of the counter.

5. The apparatus of claim 4 wherein the "and" gate is inhibited when the counter is full, preventing the passage of signals from the oscillator output means to the advance means of the counter.

References Cited

UNITED STATES PATENTS

| | | | |
|---|---|---|---|
| 3,259,851 | 7/1966 | Brauer | 331—18 X |
| 3,333,209 | 7/1967 | Hugenholtz | 331—25 |
| 3,370,252 | 2/1968 | Zoerner | 331—18 |

ROY LAKE, Primary Examiner

S. H. GRIMM, Assistant Examiner

U.S. Cl. X.R.

331—1, 14, 18, 25